United States Patent
Troia (10) Patent No.: US 11,749,322 B2
(45) Date of Patent: *Sep. 5, 2023

(54) COPY DATA IN A MEMORY SYSTEM WITH ARTIFICIAL INTELLIGENCE MODE

(71) Applicant: Micron Technology, Inc., Boise, ID (US)

(72) Inventor: Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/856,099

(22) Filed: Jul. 1, 2022

(65) Prior Publication Data

US 2022/0399050 A1 Dec. 15, 2022

Related U.S. Application Data

(63) Continuation of application No. 17/328,751, filed on May 24, 2021, now Pat. No. 11,404,108, which is a
(Continued)

(51) Int. Cl.
*G11C 7/22* (2006.01)
*G11C 11/409* (2006.01)
(Continued)

(52) U.S. Cl.
CPC ............ *G11C 7/22* (2013.01); *G06F 11/1448* (2013.01); *G06F 12/0246* (2013.01);
(Continued)

(58) Field of Classification Search
CPC ............ G06F 11/1448; G06F 12/0246; G06F 18/214; G06N 3/08; G11C 11/409; G06K 9/6256
See application file for complete search history.

(56) References Cited

U.S. PATENT DOCUMENTS 11,017,842 B2 * 5/2021 Troia .................... G11C 7/1048
11,404,108 B2 * 8/2022 Troia .................... G11C 11/409
(Continued)

OTHER PUBLICATIONS

Sebastian et al., "Temporal Correlation Detection Using Computational Phase-change Memory", Nature Communications Journal 8, Article No. 1115, Oct. 24, 2017, pp. 1-10.
(Continued)

*Primary Examiner* — Ly D Pham
(74) *Attorney, Agent, or Firm* — Brooks, Cameron & Huebsch, PLLC (57) ABSTRACT

The present disclosure includes apparatuses and methods related to copying data in a memory system with an artificial intelligence (AI) mode. An apparatus can receive a command indicating that the apparatus operate in an artificial intelligence (AI) mode, a command to perform AI operations using an AI accelerator based on a status of a number of registers, and a command to copy data between memory devices that are performing AI operations. The memory system can copy neural network data, activation function data, bias data, input data, and/or output data from a first memory device to a second memory device, such that that the first memory device can use the neural network data, activation function data, bias data, input data, and/or output data in a first AI operation and the second memory device can use the neural network data, activation function data, bias data, input data, and/or output data in a second AI operation.

19 Claims, 8 Drawing Sheets

Related U.S. Application Data continuation of application No. 16/554,924, filed on Aug. 29, 2019, now Pat. No. 11,017,842.

(51) Int. Cl.
*G06F 11/14* (2006.01)
*G06F 12/02* (2006.01)
*G06N 3/08* (2023.01)
*G06F 18/214* (2023.01)

(52) U.S. Cl.
CPC ............ *G06F 18/214* (2023.01); *G06N 3/08* (2013.01); *G11C 11/409* (2013.01)

(56) References Cited

U.S. PATENT DOCUMENTS

| | | |
|---|---|---|
| 2009/0063786 A1 | 3/2009 | Oh |
| 2016/0259739 A1 | 9/2016 | Woo et al. |
| 2017/0024644 A1 | 1/2017 | Van Der Made et al. |
| 2017/0277432 A1 | 9/2017 | Yun |
| 2017/0344283 A1 | 11/2017 | Bernat et al. |
| 2018/0189638 A1 | 7/2018 | Nurvitadhi et al. |
| 2018/0218257 A1 | 8/2018 | Xu et al. |
| 2019/0042538 A1 | 2/2019 | Koren et al. |
| 2019/0056885 A1 | 2/2019 | Mathuriya et al. |
| 2019/0057302 A1 | 2/2019 | Cho et al. |
| 2019/0079801 A1 | 3/2019 | Lyuh et al. |
| 2019/0094946 A1 | 3/2019 | Pillilli et al. |
| 2019/0205737 A1 | 7/2019 | Bleiweiss et al. |
| 2019/0235867 A1 | 8/2019 | Jaffari et al. |
| 2019/0251034 A1 | 8/2019 | Bernat et al. |
| 2019/0251038 A1 | 8/2019 | Kang et al. |
| 2019/0332260 A1 | 10/2019 | Ballard |
| 2019/0341091 A1 | 11/2019 | Sity et al. |
| 2020/0097171 A1 | 3/2020 | Yoo et al. |
| 2020/0250085 A1 | 8/2020 | Li et al. |
| 2020/0293867 A1 | 9/2020 | Shao et al. |
| 2020/0311559 A1* | 10/2020 | Chattopadhyay ...... G06N 20/00 |

OTHER PUBLICATIONS

Rios et al., "In-Memory Computing on a Photonic Platform", Jan. 18, 2018, Cornell University arXiv, retrieved from https://arxiv.org/abs/1801.06228.

"A New Brain-inspired Architecture Could Improve How Computers Handle Data and Advance AI", Oct. 3, 2018, American Institute of Physics, retrieved from https://phys.org/news/2018-10-brain-inspired-architecture-advance-ai.html.

International Search Report and Written Opinion for related PCT Application No. PCT/US2020/048154, dated Dec. 3, 2020, 12 pages.

* cited by examiner

| 230 REGISTERS | |
|---|---|
| 232-0 — REGISTER 0 — AI MODE | REGISTER 26 — DEBUG MODE — 232-26 |
| 232-1 — REGISTER 1 | REGISTER 27 — 232-27 |
| 232-2 — REGISTER 2 | REGISTER 28 — STOP LAYER — 232-28 |
| 232-3 — REGISTER 3 — INPUT | REGISTER 29 — 232-29 |
| 232-4 — REGISTER 4 | REGISTER 30 — 232-30 |
| 232-5 — REGISTER 5 | REGISTER 31 — TEMP BLOCKS — 232-31 |
| 232-6 — REGISTER 6 | REGISTER 32 — 232-32 |
| 232-7 — REGISTER 7 | REGISTER 33 — 232-33 |
| 232-8 — REGISTER 8 | REGISTER 34 — 232-34 |
| 232-9 — REGISTER 9 — OUTPUT | REGISTER 35 — 232-35 |
| 232-10 — REGISTER 10 | REGISTER 36 — ACTIVATION FUNCTIONS — 232-36 |
| 232-11 — REGISTER 11 | REGISTER 37 — 232-37 |
| 232-12 — REGISTER 12 — ENABLE | REGISTER 38 — 232-38 |
| 232-13 — REGISTER 13 | REGISTER 39 — 232-39 |
| 232-14 — REGISTER 14 | REGISTER 40 — 232-40 |
| 232-15 — REGISTER 15 | REGISTER 41 — 232-41 |
| 232-16 — REGISTER 16 | REGISTER 42 — BIAS VALUES — 232-42 |
| 232-17 — REGISTER 17 | REGISTER 43 — 232-43 |
| 232-18 — REGISTER 18 — NEURAL NETWORK | REGISTER 44 — 232-44 |
| 232-19 — REGISTER 19 | REGISTER 45 — STATUS — 232-45 |
| 232-20 — REGISTER 20 | REGISTER 46 — ERROR — 232-46 |
| 232-21 — REGISTER 21 | REGISTER 47 — SELECT ACT. FUNC — 232-47 |
| 232-22 — REGISTER 22 | REGISTER 48 — 232-48 |
| 232-23 — REGISTER 23 | REGISTER 49 — LAYER/NEURON ADDRESS — 232-49 |
| 232-24 — REGISTER 24 | REGISTER 50 — 232-50 |
| 232-25 — REGISTER 25 | |

*Fig. 2*

| BIT 7 334-7 | BIT 6 334-6 | BIT 5 334-5 | BIT 4 334-4 | BIT 3 334-3 | BIT 2 334-2 | BIT 1 334-1 | BIT 0 334-0 |
|---|---|---|---|---|---|---|---|
| | | 360 RESTART | 361 START | 362 CONTENT VAL. | 363 CLR CONTENT | 364 IN USE | 365 EXIT |

INPUT SIZE 366

NUMBER OF INPUTS 367

INPUT SA 368

INPUT EA 369

OUTPUT SIZE 370

NUMBER OF OUTPUTS 371

OUTPUT SA 372

| ENABLE TEMP 374 | ENABLE TEMP 375 | ENABLE AF 376 | ENABLE BIAS 377 | ENAB OUTPUT 378 | ENABLE NN 379 | ENABLE INPUT 380 |

NUMBER OF ROWS 381

NUMBER OF COLUMNS 382

NEURON SIZE 383

NUMBER OF NEURONS 384

NEURON SA 385

NEURON EA 386

NUMBER OF LAYERS 387

COPY DATA IN A MEMORY SYSTEM WITH ARTIFICIAL INTELLIGENCE MODE

PRIORITY INFORMATION

This application is a Continuation of U.S. application Ser. No. 17/328,751, filed May 24, 2021, which issued as U.S. Pat. No. 11,404,108 and is a Continuation of U.S. application Ser. No. 16/554,924, filed Aug. 29, 2019, which issued as U.S. Pat. No. 11,017,842 on May 25, 2021, the contents of which are included herein by reference.

TECHNICAL FIELD

The present disclosure relates generally to memory devices, and more particularly, to apparatuses and methods for copying data in a memory system with an artificial intelligence (AI) mode.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

The present disclosure includes apparatuses and methods related to copying data in a memory system with an artificial intelligence (AI) mode. An example apparatus can include receive a command indicating that the apparatus operate in an artificial intelligence (AI) mode, a command to perform AI operations using an AI accelerator based on a status of a number of registers, and a command to copy data between memory devices that are performing AI operations. The data copied between memory devices can be neural network data, activation function data, bias data, input data, and/or output data associated with AI operations. The AI accelerator can include hardware, software, and or firmware that is configured to perform operations (e.g., logic operations, among other operations) associated with AI operations. The hardware can include circuitry configured as an adder and/or multiplier to perform operations, such as logic operations, associated with AI operations.

A memory device can include data stored in the arrays of memory cells that is used by the AI accelerator to perform AI operations. Input data, along with data that defines the neural network, such neuron data, activation function data, and/or bias value data can be stored in the memory devices, copied between memory devices, and used to perform AI operations. Also, the memory devices can include temporary block to store partial results of the AI operations and output blocks to store the results of the AI operations. The host can issue a read command for the output block and the results in the output blocks can be sent to a host to complete performance of a command requesting that an AI operation be performed.

The host and/or a controller of a memory system can issue a command to copy input and/or output data between memory devices performing AI operations. For example, the memory system can copy input data from a first memory device to a second memory device, such that that the first memory device can use the input data in a first AI operation and the second memory device can use the input data in a second AI operation. The input data copied from the first memory device to the second memory device can be received from a host. The first memory device performing the first AI operation and the second memory device performing the second AI operation can include the same or different neural network data, activation function data, and/or or bias data. The results of the first and second AI operations can be reported to a controller and/or host and compared to each other.

The host and/or a controller of a memory system can issue a command to copy neural network data, activation function data, bias data between memory devices performing AI operations. The memory system can copy neural network data, activation function data, and/or bias data from a first memory device to a second memory device, such that that the first memory device can use the neural network data, activation function data, and/or bias data in a first AI operation and the second memory device can use the neural network data, activation function data, and/or bias data in a second AI operation. The results of the first and second AI operations can be reported to a host and/or a controller of a memory system and compared to each other.

Each memory device of a memory system can send input data and neuron data to the AI accelerator and the AI accelerator can perform AI operations on the input data and neuron data. The memory device can store the results of the AI operations in temporary blocks on the memory device. The memory device can send the results from the temporary blocks and apply bias value data to the AI accelerator. The AI accelerator can perform AI operations on the results from the temporary blocks using the bias value data. The memory device can store the results of the AI operations in temporary blocks on the memory device. The memory device can send the results from the temporary blocks and activation function data to the AI accelerator. The AI accelerator can perform AI operations on the results from the temporary blocks and/or the activation function data. The memory device can store the results of the AI operations in output blocks on the memory device.

The AI accelerator can reduce latency and power consumption associated with AI operations when compared to AI operations that are performed on a host. AI operations performed on a host use data that is exchanged between a memory device and the host, which adds latency and power consumption to the AI operations. While AI operations performed according to embodiments of the present disclosure can be performed on a memory device using the AI accelerator and the memory arrays, where data is not transferred from the memory device while performing the AI operations.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1A:
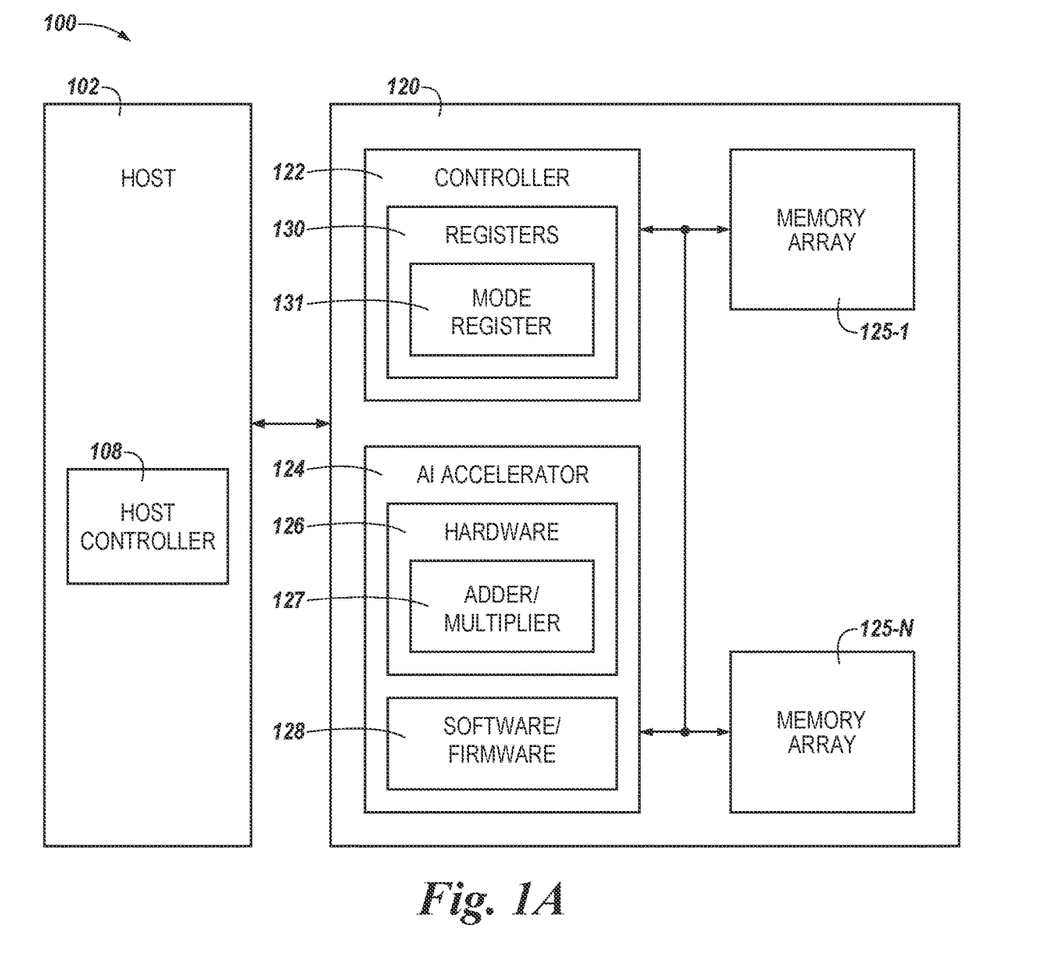
FIG. 1A is a block diagram of an apparatus in the form of a computing system including a memory device with an artificial intelligence (AI) accelerator in accordance with a number of embodiments of the present disclosure.

FIG. 1A is a block diagram of an apparatus in the form of a computing system 100 including a memory device 120 in accordance with a number of embodiments of the present disclosure. As used herein, a memory device 120, memory arrays 125-1, . . . 125-N, memory controller 122, and/or AI accelerator 124 might also be separately considered an "apparatus."

As illustrated in FIG. 1A, host 102 can be coupled to the memory device 120. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory device 120. The host controller 108 can send commands to the memory device 120. The host controller 108 can communicate with the memory device 120, memory controller 122 on memory device 120, and/or the AI accelerator 124 on memory device 120 to perform AI operations, read data, write data, and/or erase data, among other operations. AI operations may include machine learning or neural network operations, which may include training operations or inference operations, or both. In some example, each memory device 120 may represent a layer within a neural network or deep neural network (e.g., a network having three or more hidden layers). Or each memory device 120 may be or include nodes of a neural network, and a layer of the neural network may be composed of multiple memory devices or portions of several memory devices 120. Memory devices 120 may store weights (or models) for AI operations in memory arrays 125.

A physical host interface can provide an interface for passing control, address, data, and other signals between memory device 120 and host 102 having compatible receptors for the physical host interface. The signals can be communicated between host 102 and memory device 120 on a number of buses, such as a data bus and/or an address bus, for example.

Memory device 120 can include controller 122, AI accelerator 124, and memory arrays 125-1, . . . ,125-N. Memory device 120 can be a low-power double data rate dynamic random access memory, such as a LPDDR5 device, and/or a graphics double data rate dynamic random access memory, such as a GDDR6 device, among other types of devices. Memory arrays 125-1, . . . ,125-N can include a number of memory cells, such as volatile memory cells (e.g., DRAM memory cells, among other types of volatile memory cells) and/or non-volatile memory cells (e.g., RRAM memory cells, among other types of non-volatile memory cells). Memory device 120 can read and/or write data to memory arrays 125-1, . . . ,125-N. Memory arrays 125-1, . . . ,125-N can store data that is used during AI operations performed on memory device 120. Memory arrays 125-1, . . . ,125-N can store inputs, outputs, weight matrix and bias information of a neural network, and/or activation functions information used by the AI accelerator to perform AI operations on memory device 120.

The host controller 108, memory controller 122, and/or AI accelerator 124 on memory device 120 can include control circuitry, e.g., hardware, firmware, and/or software. In one or more embodiments, the host controller 108, memory controller 122, and/or AI accelerator 124 can be an application specific integrated circuit (ASIC) coupled to a printed circuit board including a physical interface. Also, memory controller 122 on memory device 120 can include registers 130. Registers 130 can be programmed to provide information for the AI accelerator to perform AI operations. Registers 130 can include any number of registers. Registers 130 can be written to and/or read by host 102, memory controller 122, and/or AI accelerator 124. Registers 130 can provide input, output, neural network, and/or activation functions information for AI accelerator 124. Registers 130 can include mode register 131 to select a mode of operation for memory device 120. The AI mode of operation can be selected by writing a word to register 131, such as 0xAA and/or 0x2AA, for example, which inhibits access to the registers associated with normal operation of memory device 120 and allows access to the registers associated with AI operations. Also, the AI mode of operation can be selected using a signature that uses a crypto algorithm that is authenticated by a key stored in the memory device 120. Registers 130 can also be located in memory arrays 125-1, . . . , 125-N and be accessible by controller 122.

AI accelerator 124 can include hardware 126 and/or software/firmware 128 to perform AI operations. Hardware 126 can include adder/multiplier 127 to perform logic operations associated with AI operations. Memory controller 122 and/or AI accelerator 124 can received commands from host 102 to perform AI operations. Memory device 120 can perform the AI operations requested in the commands from host 102 using the AI accelerator 124, data in memory arrays 125-1, . . . ,125-N, and information in registers 130. The memory device can report back information, such as results and/or error information, for example, of the AI operations to host 120. The AI operations performed by AI accelerator 124 can be performed without use of an external processing resource.

The memory arrays 125-1, . . . ,125-N can provide main memory for the memory system or could be used as additional memory or storage throughout the memory system. Each memory array 125-1, . . . ,125-N can include a number of blocks of memory cells. The blocks of memory cells can be used to store data that is used during AI operations performed by memory device 120. Memory arrays 125-1, . . . ,125-N can include DRAM memory cells, for example. Embodiments are not limited to a particular type of memory device. For instance, the memory device can include RAM, ROM, DRAM, SDRAM, PCRAM, RRAM, 3D XPoint, and flash memory, among others.

By way of example, memory device 120 may perform an AI operation that is or includes one or more inference steps. Memory arrays 125 may be layers of a neural network or may each be individual nodes and memory device 120 may be layer; or memory device 120 may be a node within a larger network. Additionally or alternatively, memory arrays 125 may store data or weights, or both, to be used (e.g., summed) within a node. Each node (e.g., memory array 125) may combine an input from data read from cells of the same or a different memory array 125 with weights read from cells of memory array 125. Combinations of weights and data may, for instance, be summed within the periphery of a memory array 125 or within hardware 126 using adder/multiplier 127. In such cases, the summed result may be passed to an activation function represented or instantiated in the periphery of a memory array 125 or within hardware 126. The result may be passed to another memory device 120 or may be used within AI accelerator 124 (e.g., by software/firmware 128) to make a decision or to train a network that includes memory device 120.

A network that employs memory device 120 may be capable of or used for supervised or unsupervised learning. This may be combined with other learning or training regimes. In some cases, a trained network or model is imported or used with memory device 120, and memory device's 120 operations are primarily or exclusively related to inference.

The embodiment of FIG. 1A can include additional circuitry that is not illustrated so as not to obscure embodiments of the present disclosure. For example, memory device 120 can include address circuitry to latch address signals provided over I/O connections through I/O circuitry. Address signals can be received and decoded by a row decoder and a column decoder to access the memory arrays 125-1, . . . ,125-N. It will be appreciated by those skilled in the art that the number of address input connections can depend on the density and architecture of the memory arrays 125-1, . . . ,125-N.

Figure 1B:
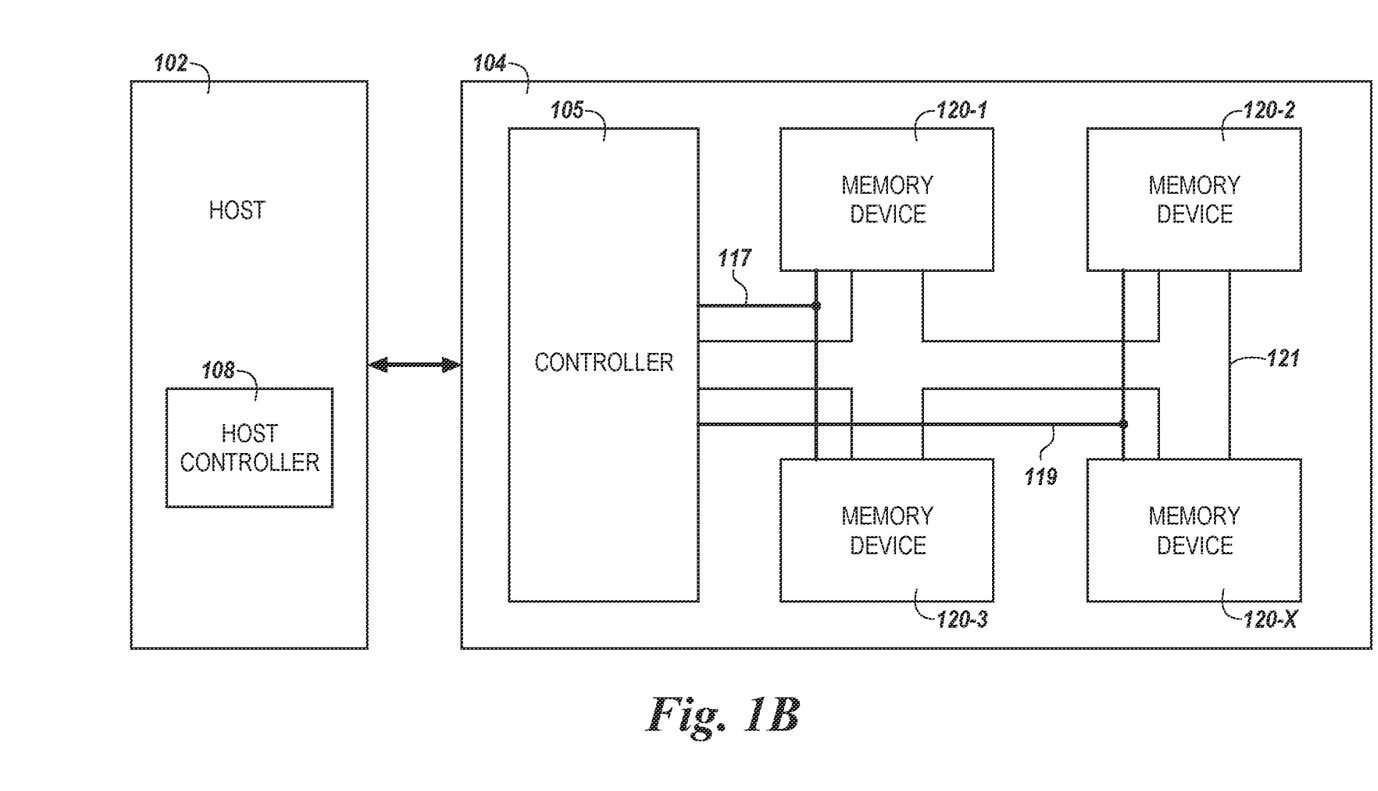
FIG. 1B is a block diagram of an apparatus in the form of a computing system including a memory system with memory devices having an artificial intelligence (AI) accelerator in accordance with a number of embodiments of the present disclosure.

FIG. 1B is a block diagram of an apparatus in the form of a computing system including a memory system with memory devices having an artificial intelligence (AI) accelerator in accordance with a number of embodiments of the present disclosure. As used herein, a memory devices 120-1, 120-2, 120-3, and 120-X, controller 10, and/or memory system 104 might also be separately considered an "apparatus."

As illustrated in FIG. 1B, host 102 can be coupled to the memory system 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory system 104. The host controller 108 can send commands to the memory system 104. The memory system 104 can include controller 105 and memory devices 120-1, 120-2, 120-3, and 120-X. Memory device 120-1, 120-2, 120-3, and 120-X can be the memory device 120 described above in association with FIG. 1A and include an AI accelerator with hardware, software, and/or firmware to perform AI operations. The host controller 108 can communicate with controller 105 and/or memory devices 120-1, 120-2, 120-3, and 120-X to perform AI operations, read data, write data, and/or erase data, among other operations. A physical host interface can provide an interface for passing control, address, data, and other signals between memory system 104 and host 102 having compatible receptors for the physical host interface. The signals can be communicated between host 102 and memory system 104 on a number of buses, such as a data bus and/or an address bus, for example.

Memory system 104 can include controller 105 coupled to memory devices 120-1, 120-2, 120-3, and 120-X via bus 121. Bus 121 can be configured such that the full bandwidth of bus 121 can be consumed when operation a portion or all of the memory devices of a memory system. For example, two memory devices of the four memory device 120-1, 120-2, 120-3, and 120-X shown in FIG. 1B can be configured to operate while using the full bandwidth of bus 121. For example, controller 105 can send a command on select line 117 that can select memory devices 120-1 and 120-3 for operation during a particular time period, such as at the same time. Controller 105 can send a command on select line 119 that can select memory device 120-2 and 120-X for operation during a particular time period, such as at the same time. In a number of embodiments, controller 105 can be configured to send commands on select lines 117 and 119 to select any combination of the memory devices 120-1, 120-2, 120-3, and 120-X.

In a number of embodiments, a command on select line 117 can be used to select memory devices 120-1 and 120-3 and a command on select line 119 can be used to select memory devices 120-2 and 120-X. The selected memory device can be used during performance of AI operations. Data associated with the AI operation can be copied and/or transferred between the selected memory devices 120-1, 120-2, 120-3, and 120-X on bus 121. For example, a first portion of an AI operation can be performed on memory device 120-1 and an output of the first portion of the AI operation can be copied to memory device 120-3 on bus 121. The output of the first portion of the AI operation can be used by memory device 120-3 as an input of a second portion of the AI operation. Also, neural network data, activation function data and/or bias data associated with an AI operation can be copied between memory devices 120-1, 120-2, 120-3, and 120-X on bus 121.

Figure 2:
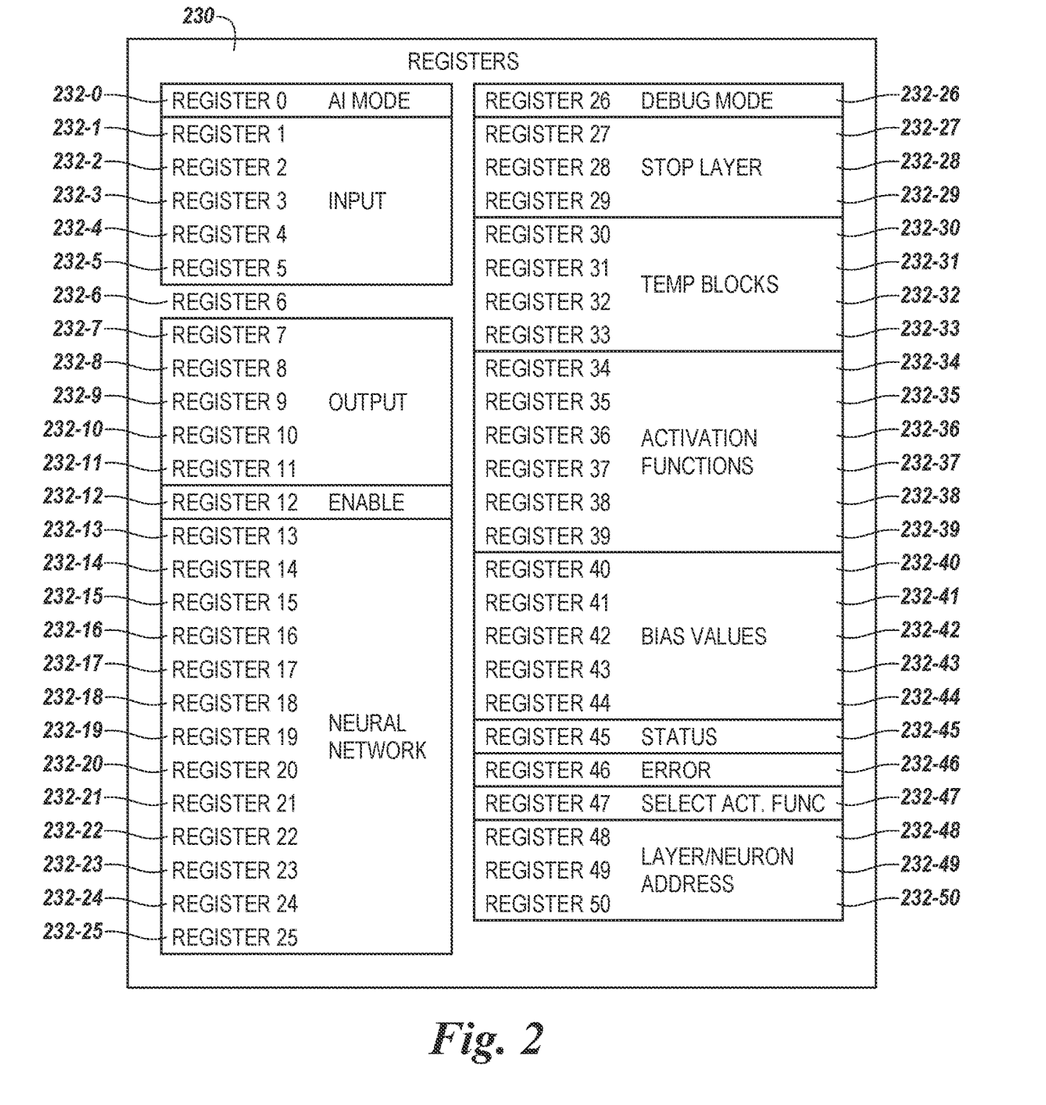
FIG. 2 is a block diagram of a number of registers on a memory device with an artificial intelligence (AI) accelerator in accordance with a number of embodiments of the present disclosure.

FIG. 2 is a block diagram of a number of registers on a memory device with an artificial intelligence (AI) accelerator in accordance with a number of embodiments of the present disclosure. Registers 230 can be AI registers and include input information, output information, neural network information, and/or activation functions information, among other types of information, for use by an AI accelerator, a controller, and/or memory arrays of a memory device (e.g., AI accelerator 124, memory controller 122, and/or memory arrays 125-1, . . . , 125-N in FIG. 1). Registers can be read and/or written to based on commands from a host, an AI accelerator, and/or a controller (e.g., host 102, AI accelerator 124, memory controller 122 in FIG. 1).

Register 232-0 can define parameters associated with AI mode of the memory device. Bits in register 232-0 can start AI operations, restart AI operations, indicate content in registers is valid, clear content from registers, and/or exit from AI mode.

Registers 232-1, 232-2, 232-3, 232-4, and 232-5 can define the size of inputs used in AI operations, the number of inputs used in AI operations, and the start address and end address of the inputs used in AI operations. Registers 232-7, 232-8, 232-9, 232-10, and 232-11 can define the size of outputs of AI operations, the number of outputs in AI operations, and the start address and end address of the outputs of AI operations.

Register 232-12 can be used to enable the usage of the input banks, the neuron banks, the output banks, the bias banks, the activation functions, and the temporary banks used during AI operations.

Registers 232-13, 232-14, 232-15, 232-16, 232-17, 232-18, 232-19, 232-20, 232-21, 232-22, 232-23, 232-24, and 232-25 can be used to define the neural network used during AI operations. Registers 232-13, 232-14, 232-15, 232-16, 232-17, 232-18, 232-19, 232-20, 232-21, 232-22, 232-23, 232-24, and 232-25 can define the size, number, and location of neurons and/or layers of the neural network used during AI operations.

Register 232-26 can enable a debug/hold mode of the AI accelerator and output to be observed at a layer of AI operations. Register 232-26 can indicate that an activation should be applied during AI operations and that the AI operation can step forward (e.g., perform a next step in an AI operation) in AI operations. Register 232-26 can indicate that the temporary blocks, where the output of the layer is located, is valid. The data in the temporary blocks can be changed by a host and/or a controller on the memory device, such that the changed data can be used in the AI operation as the AI operation steps forward. Registers 232-27, 232-28, and 232-29 can define the layer where the debug/hold mode will stop the AI operation, change the content of the neural network, and/or observe the output of the layer.

Registers 232-30, 232-31, 232-32, and 232-33 can define the size of temporary banks used in AI operations and the start address and end address of the temporary banks used in AI operations. Register 232-30 can define the start address and end address of a first temporary bank used in AI operations and register 232-33 can define the start address and end address of a first temporary bank used in AI operations. Registers 232-31, and 232-32 can define the size of the temporary banks used in AI operations.

Registers 232-34, 232-35, 232-36, 232-37, 232-38, and 232-39 can be associated with the activation functions used in AI operations. Register 232-34 can enable usage of the activation function block, enable usage of the activation function for each neuron, the activation function for each layer, and enables usage of an external activation function. Registers 232-35 can define the start address and the end address of the location of the activation functions. Registers 232-36, 232-37, 232-38, and 232-39 can define the resolution of the inputs (e.g., x-axis) and outputs (e.g., y-axis) of the activation functions and/or a custom defined activation function.

Registers 232-40, 232-41, 232-42, 232-43, and 232-44 can define the size of bias values used in AI operations, the number of bias values used in AI operations, and the start address and end address of the bias values used in AI operations.

Register 232-45 can provide status information for the AI calculations and provide information for the debug/hold mode. Register 232-45 can enable debug/hold mode, indicate that the AI accelerator is performing AI operations, indicate that the full capability of the AI accelerator should be used, indicate only matrix calculations of the AI operations should be made, and/or indicate that the AI operation can proceed to the next neuron and/or layer.

Register 232-46 can provide error information regarding AI operations. Register 232-46 can indicate that there was an error in a sequence of an AI operation, that there was an error in an algorithm of an AI operations, that there was an error in a page of data that ECC was not able to correct, and/or that there was an error in a page of data that ECC was able to correct.

Register 232-47 can indicate an activation function to use in AI operations. Register 232-47 can indicated one of a number of pre-define activation function can be used in AI operations and/or a custom activation function located in a block can be used in AI operations.

Registers 232-48, 232-49, and 232-50 can indicate the neuron and/or layer where the AI operation is executing. In the case where errors occur during the AI operations, registers 232-48, 232-49, and 232-50 the neuron and/or layer where an error occurred.

Figure 3A:
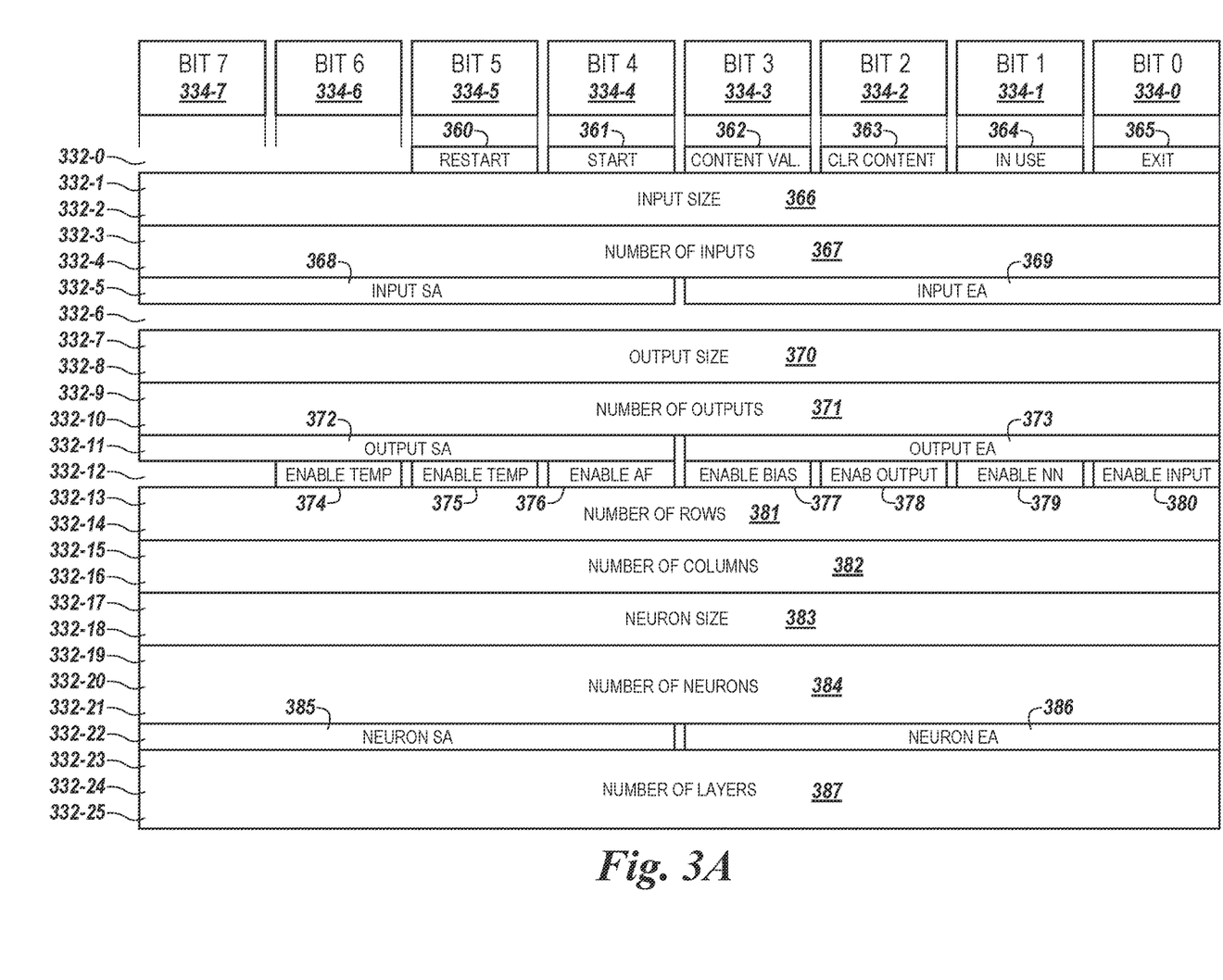
FIGS. 3A and 3B are block diagrams of a number of bits in a number of registers on a memory device with an artificial intelligence (AI) accelerator in accordance with a number of embodiments of the present disclosure.
Figure 3B:
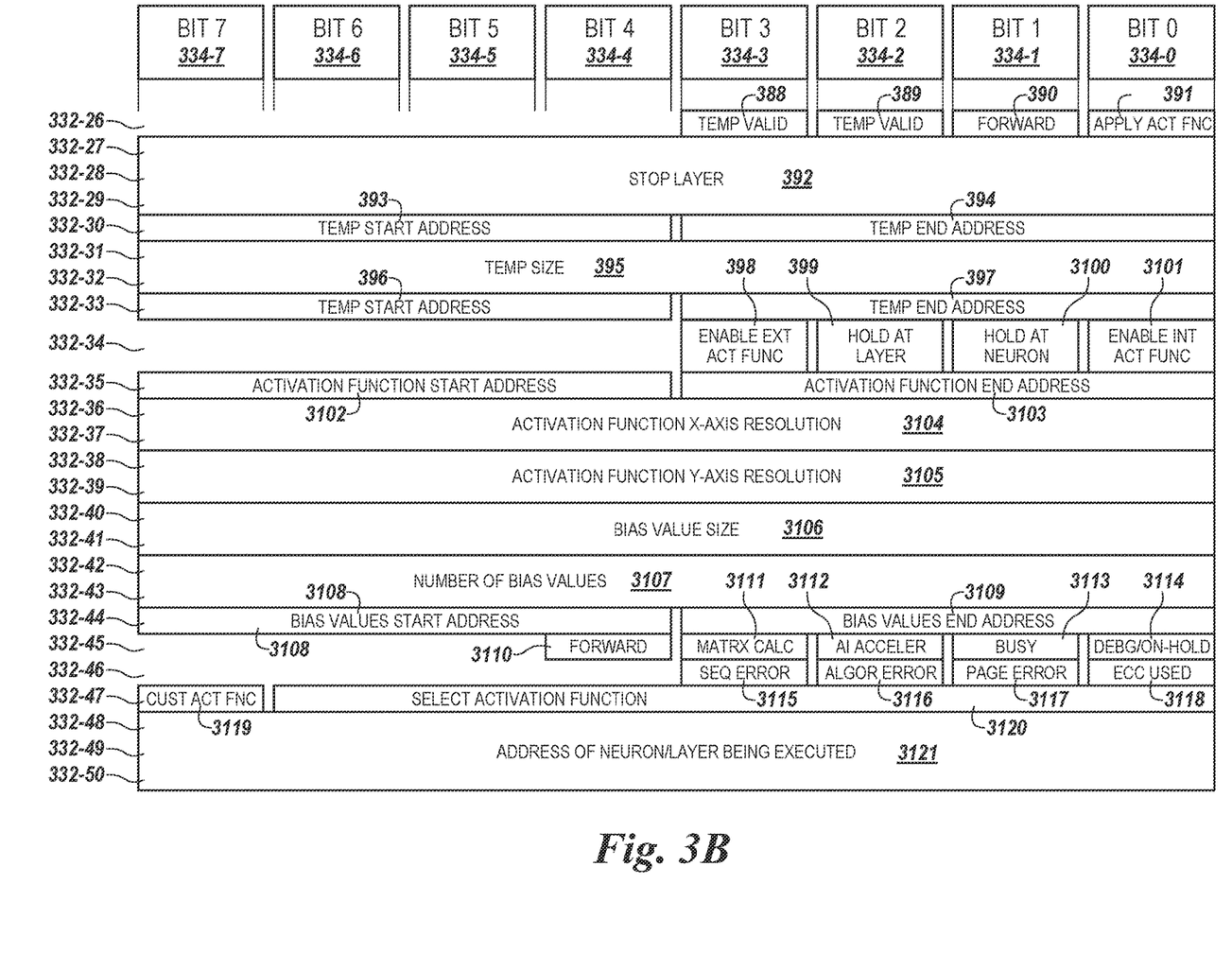

FIGS. 3A and 3B are block diagrams of a number of bits in a number of registers on a memory device with an artificial intelligence (AI) accelerator in accordance with a number of embodiments of the present disclosure. Each register 332-0, . . . , 332-50 can include a number of bits, bits 334-0, 334-1, 334-2, 334-3, 334-4, 334-5, 334-6, and 334-7, to indicate information associated with performing AI operations.

Register 332-0 can define parameters associated with AI mode of the memory device. Bit 334-5 of register 332-0 can be a read/write bit and can indicate that an elaboration of an AI operation can restart 360 at the beginning when programmed to 1 b. Bit 334-5 of register 332-0 can be reset to 0 b once the AI operation has restarted. Bit 334-4 of register 332-0 can be a read/write bit and can indicate that an elaboration of an AI operation can start 361 when programmed to 1 b. Bit 334-4 of register 332-0 can be reset to 0 b once the AI operation has started.

Bit 334-3 of register 332-0 can be a read/write bit and can indicate that the content of the AI registers is valid 362 when programmed to 1 b and invalid when programmed to 0 b. Bit 334-2 of register 332-0 can be a read/write bit and can indicate that the content of the AI registers is to be cleared 363 when programmed to 1 b. Bit 334-1 of register 332-0 can be a read only bit and can indicate that the AI accelerator is in use 364 and performing AI operations when programmed to 1 b. Bit 334-0 of register 332-0 can be a write only bit and can indicate that the memory device is to exit 365 AI mode when programmed to 1 b.

Registers 332-1, 332-2, 332-3, 332-4, and 332-5 can define the size of inputs used in AI operations, the number of inputs used in AI operations, and the start address and end address of the inputs used in AI operations. Bits 334-0, 334-1, 334-2, 334-3, 334-4, 334-5, 334-6, and 334-7 of registers 332-1 and 332-2 can define the size of the inputs 366 used in AI operations. The size of the inputs can indicate the width of the inputs in terms of number of bits and/or the type of input, such as floating point, integer, and/or double, among other types. Bits 334-0, 334-1, 334-2, 334-3, 334-4, 334-5, 334-6, and 334-7 of registers 332-3 and 332-4 can indicate the number of inputs 367 used in AI operations. Bits 334-4, 334-5, 334-6, and 334-7 of register 332-5 can indicate a start address 368 of the blocks in memory arrays of the inputs used in AI operations. Bits 334-0, 334-1, 334-2, and 334-3 of register 332-5 can indicate an end address 369 of the blocks in memory arrays of the inputs used in AI operations. If the start address 368 and the end address 369 is the same address, only one block of input is indicated for the AI operations.

Registers 332-7, 332-8, 332-9, 332-10, and 332-11 can define the size of outputs of AI operations, the number of outputs in AI operations, and the start address and end address of the outputs of AI operations. Bits 334-0, 334-1, 334-2, 334-3, 334-4, 334-5, 334-6, and 334-7 of registers 332-7 and 332-8 can define the size 370 of the outputs used in AI operations. The size of the outputs can indicate the width of the outputs in terms of number of bits and/or the type of output, such as floating point, integer, and/or double, among other types. Bits 334-0, 334-1, 334-2, 334-3, 334-4, 334-5, 334-6, and 334-7 of registers 332-9 and 332-10 can indicate the number of outputs 371 used in AI operations. Bits 334-4, 334-5, 334-6, and 334-7 of register 332-11 can indicate a start address 372 of the blocks in memory arrays of the outputs used in AI operations. Bits 334-0, 334-1, 334-2, and 334-3 of register 332-11 can indicate an end address 373 of the blocks in memory arrays of the outputs used in AI operations. If the start address 372 and the end address 373 is the same address, only one block of output is indicated for the AI operations.

Register 332-12 can be used to enable the usage of the input banks, the neuron banks, the output banks, the bias banks, the activation functions, and the temporary banks used during AI operations. Bit 334-0 of register 332-12 can enable the input banks 380, bit 334-1 of register 332-12 can enable the neural network banks 379, bit 334-2 of register 332-12 can enable the output banks 378, bit 334-3 of register 332-12 can enable the bias banks 377, bit 334-4 of register 332-12 can enable the activation function banks 376, and bit 334-5 and 334-6 of register 332-12 can enable a first temporary 375 banks and a second temporary bank 374.

Registers 332-13, 332-14, 332-15, 332-16, 332-17, 332-18, 332-19, 332-20, 332-21, 332-22, 332-23, 332-24, and 332-25 can be used to define the neural network used during AI operations. Bits 334-0, 334-1, 334-2, 334-3, 334-4, 334-5, 334-6, and 334-7 of registers 332-13 and 332-14 can define the number of rows 381 in a matrix used in AI operations. Bits 334-0, 334-1, 334-2, 334-3, 334-4, 334-5, 334-6, and 334-7 of registers 332-15 and 332-16 can define the number of columns 382 in a matrix used in AI operations.

Bits 334-0, 334-1, 334-2, 334-3, 334-4, 334-5, 334-6, and 334-7 of registers 332-17 and 332-18 can define the size of the neurons 383 used in AI operations. The size of the neurons can indicate the width of the neurons in terms of number of bits and/or the type of input, such as floating point, integer, and/or double, among other types. Bits 334-0, 334-1, 334-2, 334-3, 334-4, 334-5, 334-6, and 334-7 of registers 332-19, 332-20, and 322-21 can indicate the number of neurons 384 of the neural network used in AI operations. Bits 334-4, 334-5, 334-6, and 334-7 of register 332-22 can indicate a start address 385 of the blocks in memory arrays of the neurons used in AI operations. Bits 334-0, 334-1, 334-2, and 334-3 of register 332-5 can indicate an end address 386 of the blocks in memory arrays of the neurons used in AI operations. If the start address 385 and the end address 386 is the same address, only one block of neurons is indicated for the AI operations. Bits 334-0, 334-1, 334-2, 334-3, 334-4, 334-5, 334-6, and 334-7 of registers 332-23, 332-24, and 322-25 can indicate the number of layers 387 of the neural network used in AI operations.

Register 332-26 can enable a debug/hold mode of the AI accelerator and an output to be observed at a layer of AI operations. Bit 334-0 of register 332-26 can indicate that the AI accelerator is in a debug/hold mode and that an activation function should be applied 391 during AI operations. Bit 334-1 of register 332-26 can indicate that the AI operation can step forward 390 (e.g., perform a next step in an AI operation) in AI operations. Bit 334-2 and bit 334-3 of register 232-26 can indicate that the temporary blocks, where the output of the layer is located, is valid 388 and 389. The data in the temporary blocks can be changed by a host and/or a controller on the memory device, such that the changed data can be used in the AI operation as the AI operation steps forward.

Bits 334-0, 334-1, 334-2, 334-3, 334-4, 334-5, 334-6, and 334-7 of registers 332-27, 332-28, and 332-29 can define the layer where the debug/hold mode will stop 392 the AI operation and observe the output of the layer.

Registers 332-30, 332-31, 332-32, and 332-33 can define the size of temporary banks used in AI operations and the start address and end address of the temporary banks used in AI operations. Bits 334-4, 334-5, 334-6, and 334-7 of register 332-30 can define the start address 393 of a first temporary bank used in AI operations. Bits 334-0, 334-1, 334-2, and 334-3 of register 332-30 can define the end address 394 of a first temporary bank used in AI operations. Bits 334-0, 334-1, 334-2, 334-3, 334-4, 334-5, 334-6, and 334-7 of registers 332-31 and 332-32 can define the size 395 of the temporary banks used in AI operations. The size of the temporary banks can indicate the width of the temporary banks in terms of number of bits and/or the type of input, such as floating point, integer, and/or double, among other types. Bits 334-4, 334-5, 334-6, and 334-7 of register 332-33 can define the start address 396 of a second temporary bank used in AI operations. Bits 334-0, 334-1, 334-2, and 334-3 of register 332-34 can define the end address 397 of a second temporary bank used in AI operations.

Registers 332-34, 332-35, 332-36, 332-37, 332-38, and 332-39 can be associated with the activation functions used in AI operations. Bit 334-0 of register 332-34 can enable usage of the activation function block 3101. Bit 334-1 of register 332-34 can enable holding that AI at a neuron 3100 and usage of the activation function for each neuron. Bit 334-2 of register 332-34 can enable holding the AI at a layer 399 and the usage of the activation function for each layer. Bit 334-3 of register 332-34 can enable usage of an external activation function 398.

Bits 334-4, 334-5, 334-6, and 334-7 of register 332-35 can define the start address 3102 of activation function banks used in AI operations. Bits 334-0, 334-1, 334-2, and 334-3 of register 332-35 can define the end address 3103 of activation functions banks used in AI operations. Bits 334-0, 334-1, 334-2, 334-3, 334-4, 334-5, 334-6, and 334-7 of registers 332-36 and 332-37 can define the resolution of the inputs (e.g., x-axis) 3104 of the activation functions. Bits 334-0, 334-1, 334-2, 334-3, 334-4, 334-5, 334-6, and 334-7 of registers 332-38 and 332-39 can define the resolution and/or the outputs (e.g., y-axis) 3105 of the activation functions for a given x-axis value of a custom activation function.

Registers 332-40, 332-41, 332-42, 332-43, and 332-44 can define the size of bias values used in AI operations, the number of bias values used in AI operations, and the start address and end address of the bias values used in AI operations. Bits 334-0, 334-1, 334-2, 334-3, 334-4, 334-5, 334-6, and 334-7 of registers 332-40 and 332-41 can define the size of the bias values 3106 used in AI operations. The size of the bias values can indicate the width of the bias values in terms of number of bits and/or the type of bias values, such as floating point, integer, and/or double, among other types. Bits 334-0, 334-1, 334-2, 334-3, 334-4, 334-5, 334-6, and 334-7 of registers 332-42 and 332-43 can indicate the number of bias values 3107 used in AI operations. Bits 334-4, 334-5, 334-6, and 334-7 of register 332-44 can indicate a start address 3108 of the blocks in memory arrays of the bias values used in AI operations. Bits 334-0, 334-1, 334-2, and 334-3 of register 332-44 can indicate an end address 3109 of the blocks in memory arrays of the bias values used in AI operations. If the start address 3108 and the end address 3109 is the same address, only one block of bias values is indicated for the AI operations.

Register 332-45 can provide status information for the AI calculations and provide information for the debug/hold mode. Bit 334-0 of register 332-45 can activate the debug/hold mode 3114. Bit 334-1 of register 332-45 can indicate that the AI accelerator is busy 3113 and performing AI operations. Bit 334-2 of register 332-45 can indicate that the AI accelerator is on 3112 and/or that the full capability of the AI accelerator should be used. Bit 334-3 of register 332-45 can indicate only matrix calculations 3111 of the AI operations should be made. Bit. 334-4 of register 332-45 can indicate that the AI operation can step forward 3110 and proceed to the next neuron and/or layer.

Register 332-46 can provide error information regarding AI operations. Bit 334-3 of register 332-46 can indicate that there was an error in a sequence 3115 of an AI operation. Bit 334-2 of register 332-46 can indicate that there was an error in an algorithm 3116 of an AI operation. Bit 334-1 of register 332-46 can indicate there was an error in a page of data that ECC was not able to correct 3117. Bit 334-0 of register 332-46 can indicate there was an error in a page of data that ECC was able to correct 3118.

Register 332-47 can indicate an activation function to use in AI operations. Bits 334-0, 334-1, 334-2, 334-3, 334-4, 334-5, and 334-6 of register 332-47 can indicate one of a number of pre-define activation functions 3120 can be used in AI operations. Bit 334-7 of register 332-47 can indicate a custom activation function 3119 located in a block can be used in AI operations.

Registers 332-48, 332-49, and 332-50 can indicate the neuron and/or layer 3121 where the AI operation is executing. Bits 334-0, 334-1, 334-2, 334-3, 334-4, 334-5, 334-6, and 334-7 of registers 332-48, 332-49, and 332-50 can indicate the address of the neuron and/or layer where the AI operation is executing. In the case where errors occur during the AI operations, registers 332-48, 332-49, and 332-50 can indicate the neuron and/or layer where an error occurred.

Figure 4:
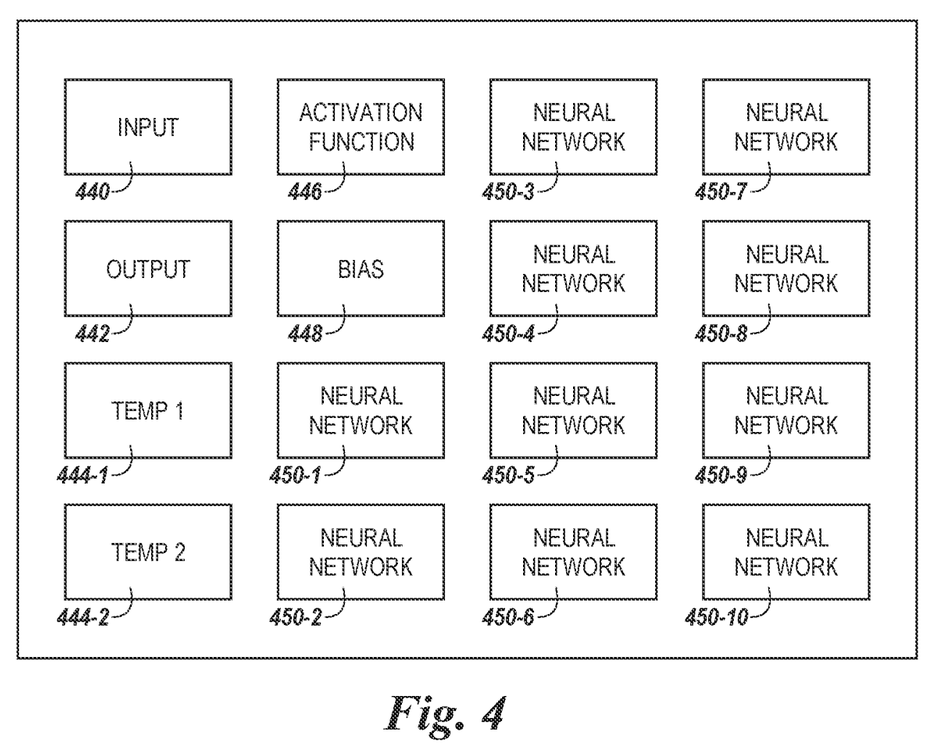
FIG. 4 is a block diagram of a number of blocks of a memory device with an artificial intelligence (AI) accelerator in accordance with a number of embodiments of the present disclosure

FIG. 4 is a block diagram of a number of blocks of a memory device with an artificial intelligence (AI) accelerator in accordance with a number of embodiments of the present disclosure. Input block 440 is a block in the memory arrays where input data is stored. Data in input block 440 can be used as the input for AI operations. The address of input block 440 can be indicated in register 5 (e.g. register 232-5 in FIGS. 2 and 332-5 in FIG. 3A). Embodiments are not limited to one input block as there can be a plurality of input blocks. Data input block 440 can be sent to the memory device from the host. The data can accompany a command indicated that AI operations should be performed on the memory device using the data.

Output block 442 is a block in the memory arrays where output data from AI operations is stored. Data in output block 442 can be used store the output from AI operations and sent to the host. The address of output block 442 can be indicated in register 11 (e.g. register 232-11 in FIGS. 2 and 332-11 in FIG. 3A). Embodiments are not limited to one output block as there can be a plurality of output blocks.

Data in output block 442 can be sent to host upon completion and/or holding of an AI operation. Temporary blocks 444-1 and 444-2 can be blocks in memory arrays where data is stored temporarily while AI operations are being performed. Data can be stored in temporary blocks 444-1 and 444-2 while the AI operations are iterating through the neuron and layers of the neural network used for the AI operations. The address of temporary block 444 can be indicated in registers 30 and 33 (e.g. registers 232-30 and 232-33 in FIGS. 2 and 332-30 and 332-33 in FIG. 3B). Embodiments are not limited to two temporary blocks as there can be a plurality of temporary blocks.

Activation function block 446 is a block in the memory arrays where the activations functions for the AI operations are stored. Activation function block 446 can store pre-defined activation functions and/or custom activation functions that are created by the host and/or AI accelerator. The address of activation function block 446 can be indicated in register 35 (e.g. register 232-35 in FIGS. 2 and 332-35 in FIG. 3B). Embodiments are not limited to one activation function block as there can be a plurality of activation function blocks.

Bias values block 448 is a block in the memory array where the bias values for the AI operations are stored. The address of bias values block 448 can be indicated in register 44 (e.g. register 232-44 in FIGS. 2 and 332-44 in FIG. 3B). Embodiments are not limited to one bias value block as there can be a plurality of bias value blocks.

Neural network blocks 450-1, 450-2, 450-3, 450-4, 450-5, 450-6, 450-7, 450-8, 450-9, and 450-10 are a block in the memory array where the neural network for the AI operations are stored. Neural network blocks 450-1, 450-2, 450-3, 450-4, 450-5, 450-6, 450-7, 450-8, 450-9, and 450-10 can store the information for the neurons and layers that are used in the AI operations. The address of neural network blocks 450-1, 450-2, 450-3, 450-4, 450-5, 450-6, 450-7, 450-8, 450-9, and 450-10 can be indicated in register 22 (e.g. register 232-22 in FIGS. 2 and 332-22 in FIG. 3A).

Figure 5:
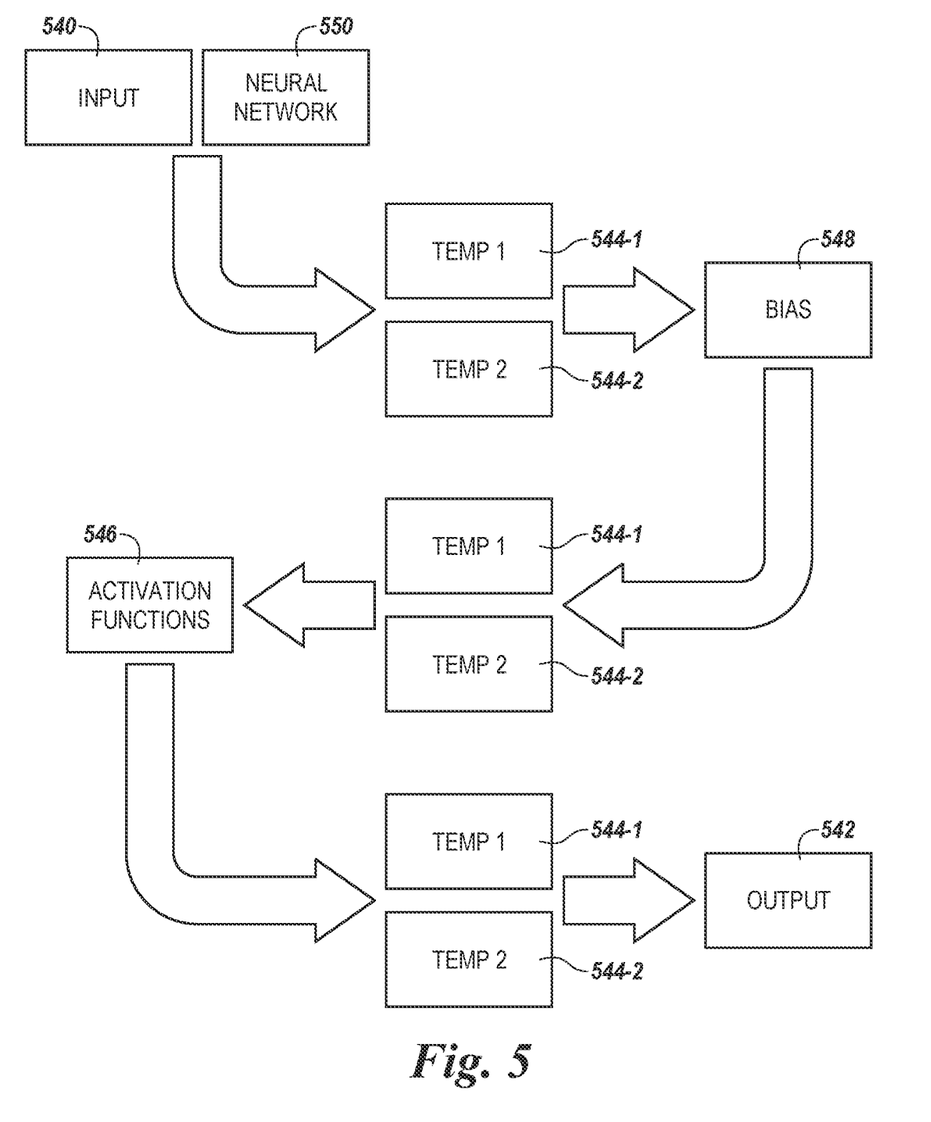
FIG. 5 is a flow diagram illustrating an example artificial intelligence process in a memory device with an artificial intelligence (AI) accelerator in accordance with a number of embodiments of the present disclosure.

FIG. 5 is a flow diagram illustrating an example artificial intelligence process in a memory device with an artificial intelligence (AI) accelerator in accordance with a number of embodiments of the present disclosure. In response to staring an AI operation, an AI accelerator can write input data 540 and neural network data 550 to the input and neural network block, respectively. The AI accelerator can perform AI operations using input data 540 and neural network data 550. The results can be stored in temporary banks 544-1 and 544-2. The temporary banks 544-1 and 544-2 can be used to store data while performing matrix calculations, adding bias data, and/or to applying activation functions during the AI operations.

An AI accelerator can receive the partial results of AI operations stored in temporary banks 544-1 and 544-2 and bias value data 548 and perform AI operations using the partial results of AI operations bias value data 548. The results can be stored in temporary banks 544-1 and 544-2.

An AI accelerator can receive the partial results of AI operations stored in temporary banks 544-1 and 544-2 and activation function data 546 and perform AI operations using the partial results of AI operations and activation function data 546. The results can be stored in output banks 542.

Figure 6:
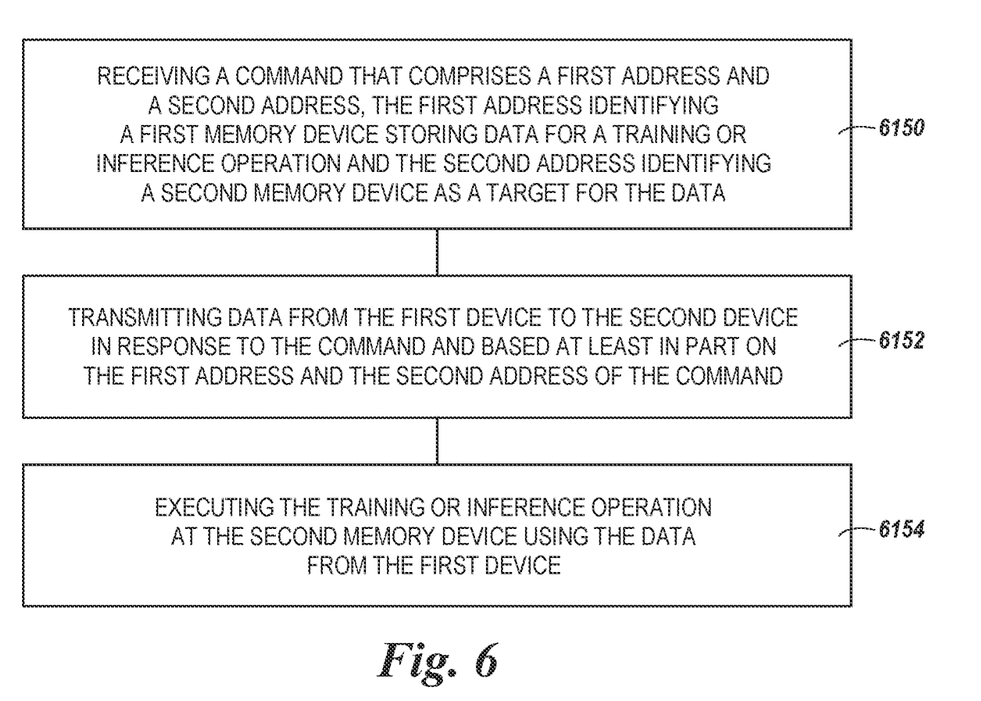
FIG. 6 is a flow diagram illustrating an example method to copy data in accordance with a number of embodiments of the present disclosure.

FIG. 6 is a flow diagram illustrating an example method to copy data in accordance with a number of embodiments of the present disclosure. The method described in FIG. 6 can be performed by, for example, a memory system including a memory device such as memory device 120 shown in FIGS. 1A and 1B.

At block 6150, the method can include receiving a command that comprises a first address and second address, the first address identifying a first memory device storing data for a training or inference operation and the second address identifying a second memory device as a target for the data. The method can include copying data from a first memory device to a second memory device of a memory system. For example, the first memory device can copy an output block to an input block of the second memory device. The host and/or controller can format the data for storage on the second memory device and use in AI operations.

At block 6152, the method can include transmitting data from the first device to the second device in response to the command and based at least in part on the first address and the second address of the command. The method can include enabling the second memory device to perform an artificial intelligence (AI) operation by programming a register on the second memory device to enter artificial intelligence (AI) mode.

At block 6154, the method can include executing the training or the inference operation at the second memory device using the data from the first device. The method can include performing the artificial intelligence (AI) operation on the second memory device using the data copied from the first memory device. The method can include coping data between memory devices that are coupled together. For example, when the density of the neural network is too large to be stored on a single memory device, the input, output, and/or temporary blocks can be copied between memory devices to execute the AI operations of the neural network.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
sending a command to copy data from a first memory device to a second memory device and to execute a training or inference operation on the second memory device,
wherein the command comprises a first address and a second address, the first address identifying the first memory device storing the data associated with the training or inference operation and the second address identifying the second memory device as a target for the data.

2. The method of claim 1, further comprising sending the command when the first memory device and the second memory devices are performing artificial intelligence (AI) operations.

3. The method of claim 1, further comprising receiving an additional command indicating that an apparatus comprising the first memory device and the second memory device operate in an artificial intelligence (AI) mode.

4. The method of claim 1, further comprising receiving an additional command to perform artificial intelligence (AI) operations using an AI accelerator based on a status of each of a number of registers.

5. The method of claim 1, further comprising performing another training or inference operation on the first memory device.

6. A system, comprising:
a number of memory devices coupled to a controller, wherein each of the number of memory devices is configured as part of a neural network and include a number of memory arrays; and the controller configured to:
send a command to copy data from a first memory device of the number of memory devices to a second memory device of the number of memory devices, wherein the first memory device and the second memory device are performing artificial intelligence (AI) operations using the data; and
execute a training or inference operation on the second memory device, wherein the command comprises a first address and a second address, the first address identifying the first memory device storing the data associated with the training or inference operation and the second address identifying the second memory device as a target for the data.

7. The system of claim 6, wherein the copied data is neural network data.

8. The system of claim 6, wherein the copied data is activation function data.

9. The system of claim 6, further comprising the controller configured to copy the data from the first memory device to a third memory device of the number of memory devices in response to receiving another command that comprises the first address and a third address, the first address identifying the first memory device storing data for the training or inference operation and the third address identifying the third memory device as a target for the data.

10. The system of claim 9, further comprising the controller configured to perform another training or inference operation on the third memory device using the data copied from the first memory device.

11. A system, comprising:
a number of memory devices coupled to a controller, wherein each of the number of memory devices is configured as part of a neural network;
a plurality of registers configured to define the neural network used during an artificial intelligence (AI) operation; and
the controller configured to:
receive a first command that comprises a first address and a second address, the first address identifying a first memory device storing data for a training or inference operation and the second address identifying a second memory device as a target for the data;
send a second command to the first memory device to:
read the data from a first memory array in the first memory device and transmit the data to a second memory array in the second memory device of the number of memory devices; and
perform the AI operation on the first memory device using the data.

12. The system of claim 11, further comprising the controller configured to send a third command to the second memory device to:
receive the data and write the data to the second memory array in the second memory device; and
perform the AI operation on the second memory device using the data.

13. The system of claim 11, wherein the plurality of registers configured to define the neural network comprises the plurality of registers configured to:
define a size of temporary banks used in the AI operation; and
define a start address and an end address of the temporary banks.

14. The system of claim 11, further comprising the plurality of registers configured to enable a debug mode of an AI accelerator of the system.

15. The system of claim 11, wherein the plurality of registers configured to define the neural network comprises the plurality of registers configured to define a size, a number, and a location of neurons of the neural network used during the AI operation or other AI operations.

16. The system of claim 11, wherein the plurality of registers configured to define the neural network comprises the plurality of registers configured to define a size, a number, and a location of layers of the neural network used during the AI operation or other AI operations.

17. The system of claim 11, wherein the plurality of registers configured to define the neural network comprises the plurality of registers configured to:
define a layer where a debug mode stops the AI operation;
change a content of the neural network;
observe an output of the layer; or
a combination thereof.

18. The system of claim 13, wherein the plurality of registers configured to define the neural network comprises the plurality of registers configured to:
enable usage of an activation function for each neuron of the neural network;
enable usage of the activation function for each layer of the neural network; and
enable usage of an external activation function.

19. The system of claim 13, wherein the plurality of registers configured to define the neural network comprises the plurality of registers configured to:
define a size of bias values used in the AI operation; and
define a number of bias values used in the AI operation.

* * * * *